(12) United States Patent
Shi et al.

(10) Patent No.: US 6,798,253 B1
(45) Date of Patent: Sep. 28, 2004

(54) SIGNAL SORTING DEVICE AND METHOD

(75) Inventors: Bingxue Shi, Beijing (CN); Guoxing Li, Beijing (CN)

(73) Assignee: Windbound Electronics Corporation, Hsinchu (TW)

(*) Notice: Subject to any disclaimer, the term of this patent is extended or adjusted under 35 U.S.C. 154(b) by 0 days.

(21) Appl. No.: 10/418,138

(22) Filed: Apr. 18, 2003

(51) Int. Cl.[7] ............................................. H03K 5/22
(52) U.S. Cl. .............................. 327/63; 327/94
(58) Field of Search .......................... 327/50–53, 58, 327/60, 63–70, 72–82, 90–91, 94

(56) References Cited

U.S. PATENT DOCUMENTS

| | | | | |
|---|---|---|---|---|
| 5,576,645 A | * | 11/1996 | Farwell ........................ | 327/94 |
| 6,021,172 A | * | 2/2000 | Fossum et al. ............... | 377/60 |
| 6,549,043 B2 | * | 4/2003 | Roovers ....................... | 327/94 |

\* cited by examiner

Primary Examiner—My-Trang Nu Ton
(74) Attorney, Agent, or Firm—Finnegan, Henderson, Farabow, Garrett & Dunner, L.L.P.

(57) ABSTRACT

A current sorter has an input section, a comparing section, and a control section. The input section includes a first input unit and a second input unit and generate a first output signal that is indicative of the first input signal and a second output signal that is indicative of a level of the second input signal. The comparing section is coupled with the input section and compares the first output signal and the second output signal to responsively generate a result. The comparing section includes a first comparing unit and a second comparing unit. The control section is coupled with the input section and the comparing section. Furthermore, the control section activates, when receiving an initial load signal, the first input unit, the second input unit, the first comparing unit, and the second comparing unit. Moreover, the control section deactivates, before receiving a second load signal, at least one of the first input unit and the first comparing unit when the first output signal is greater than the second output signal. In addition, the result generated by the comparing section is indicative of a level of the first output signal.

33 Claims, 8 Drawing Sheets

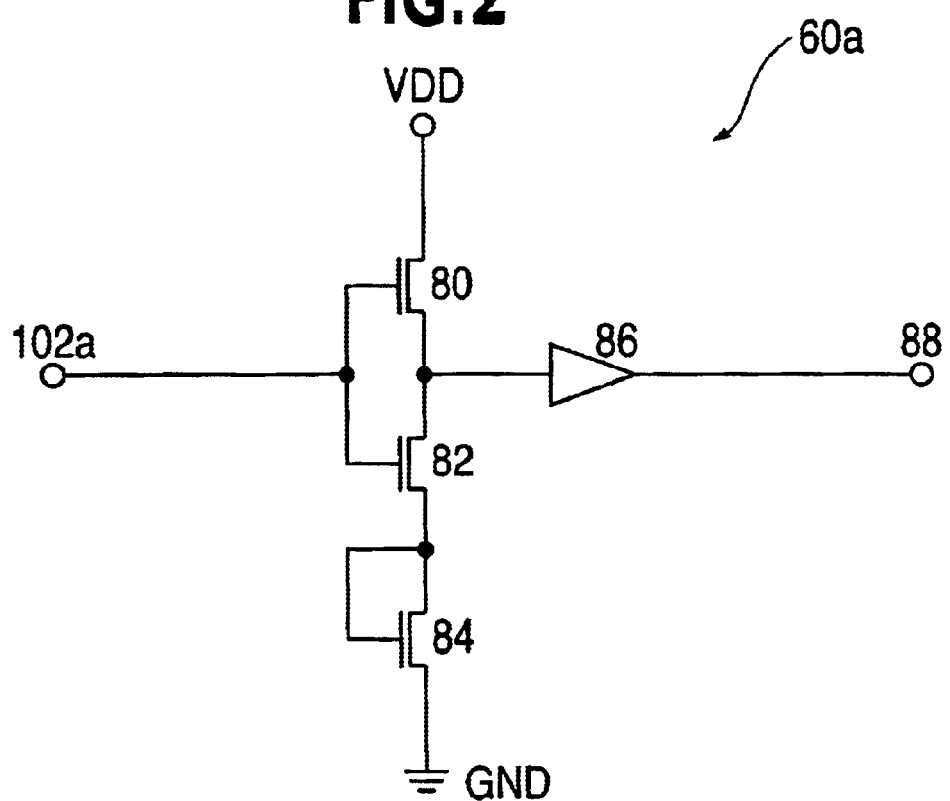

SIGNAL SORTING DEVICE AND METHOD

BACKGROUND OF THE INVENTION

1. Field of the Invention

This invention pertains to a signal sorting device and a signal sorting method, and more particularly, to a signal sorting device and a signal sorting method hat can provide output signals in a predetermined order.

2. Description of the Prior Art

Signal sorting devices have numerous applications in various fields of signal processing. Such devices may be implemented via a sorting network, a sorting system, or a sorting module that works jointly with other devices in a signal processing system. In general, a sorting device sorts a number of input signals, usually of unknown levels, which may be signal levels such as current or voltage levels, to generate a sorted and/or sampled result that becomes representative of he input signals in a specific order. A signal processing system then uses the sorted and/or sampled result for various applications, such as signal processing, image identification or comparison, handwriting recognition, and data comparison.

Common sorting approaches for performing a sorting operation include employing sorting algorithms, such as selection sort, bubble sort, comb-sort, insertion sort, merge sort and quick sort. However, these sorting approaches are designed for software implementations and, in many instances, are not fit for integrated circuit ("IC") implementations, such as implementations with modern very large scale integration ("VLSI") technology.

SUMMARY OF THE INVENTION

Accordingly, the present invention is directed to a signal sorting device and a signal sorting method that may obviate many known problems due to limitations and disadvantages of the related art.

Additional features and advantages of embodiments consistent with the invention will be set forth in the description which follows, and in part will be apparent from the description, or may be learned by practice of the invention. Such features may be realized and attained by the device particularly pointed out in the written description and claims hereof, as well as the appended drawings.

A first aspect of the present invention provides a signal sorting device hat includes an input section, a comparing section, and a control section. The input section includes a first input unit and a second input unit. The first input unit receives a first input signal to responsively generate a first output signal that is indicative of a level of the first input signal. The second input unit receives a second input signal to responsively generate a second output signal that is indicative of a level of the second input signal.

The comparing section is coupled to the input section and compares the first output signal and the second output signal to responsively generate a result. The comparing section includes a first comparing unit and a second comparing unit. The control section is coupled to with the input section and the comparing section. Furthermore, the control section, when receiving an initial load signal, activates the first input unit, the second input unit, the first comparing unit, and the second comparing unit. The control section deactivates, before receiving a second load signal, at least one of the first input unit and the first comparing unit when the first output signal is greater than the second output signal. In addition, the result provided by the comparing section is indicative of a level of the first output signal when the first output signal is greater than the second output signal.

A second aspect of the present invention provides a current sorter that includes an input section, a comparing section, and a control section. The input section receives at least two current input signals to responsively generate at least two current output signals. The input section generates at least one current output signal for each current input signal of the various current input signals. The current output signal is indicative of a current level of a corresponding current input signal of the various current input signals.

The comparing section is coupled with the input section and compares the current output signals to responsively generate a result that is indicative of a largest current output signal, which is a current output signal having the largest current among the current output signals. The control section is coupled with the input section and the comparing section. The control section receives load signals, connects the current input signals to the input section upon receiving an initial load signal of the load signals, and disconnects from the input section a largest current input signal, which is a current input signal having the largest current among the current input signals, before receiving a second load signal of the load signals. The largest current output signal corresponds the largest current input signal and is indicative of a current level of the largest current input signal.

A third aspect of the present invention provides an output sequencing device that includes an input terminal, a clock section, and sample and hold units. The input terminal provides an input signal from an output terminal of a signal sorting device. The clock section provides a clock signal. The sample and hold unit is coupled to the input terminal and the clock section. The sample and hold unit, when receiving the clock signal, samples and holds a signal level of the input signal and generates a sampled output that is indicative of the signal level of the input signal at a time when the sample and hold unit receives the clock signal.

A fourth aspect of the present invention provides a signal sorting method comprising: providing a first input signal and a second input signal; generating a first output signal that is indicative of a level of the first input signal and generating a second output signal that is indicative of a level of the second input signal; comparing the first output signal and the second output signal and generating result that is indicative of a level of the first output signal when the first output signal is greater than the second output signal; and disconnecting at least one of the first input signal and the first output signal after the result is generated.

A fifth aspect of the present invention provides current sorting method comprising: providing at least two current input signals; generating at least two current output signals to provide at least one current output signal for each current input signal of the current input signals so that the current output signal provided is indicative of a current level of a corresponding current input signal of the current input signals; comparing the current output signals to generate a result that is indicative of a largest current output signal, which is a current output signal having the largest current among the current output signals; and disconnecting a largest current input signal, which is a current input having the largest current among the current input signals, wherein the largest current output signal corresponds to the largest current input signal and is indicative of a current level of the largest current input signal.

BRIEF DESCRIPTION OF THE DRAWINGS

The accompanying drawings, which are incorporated in and constitute a part of this specification, illustrate various embodiments of the invention and together with the description, serve to explain the principles of the invention. In the drawings.

FIG. 2 shows an asymmetric inverter circuit consistent with an embodiment of the present invention;

DESCRIPTION OF THE EMBODIMENTS

Figure 1A:
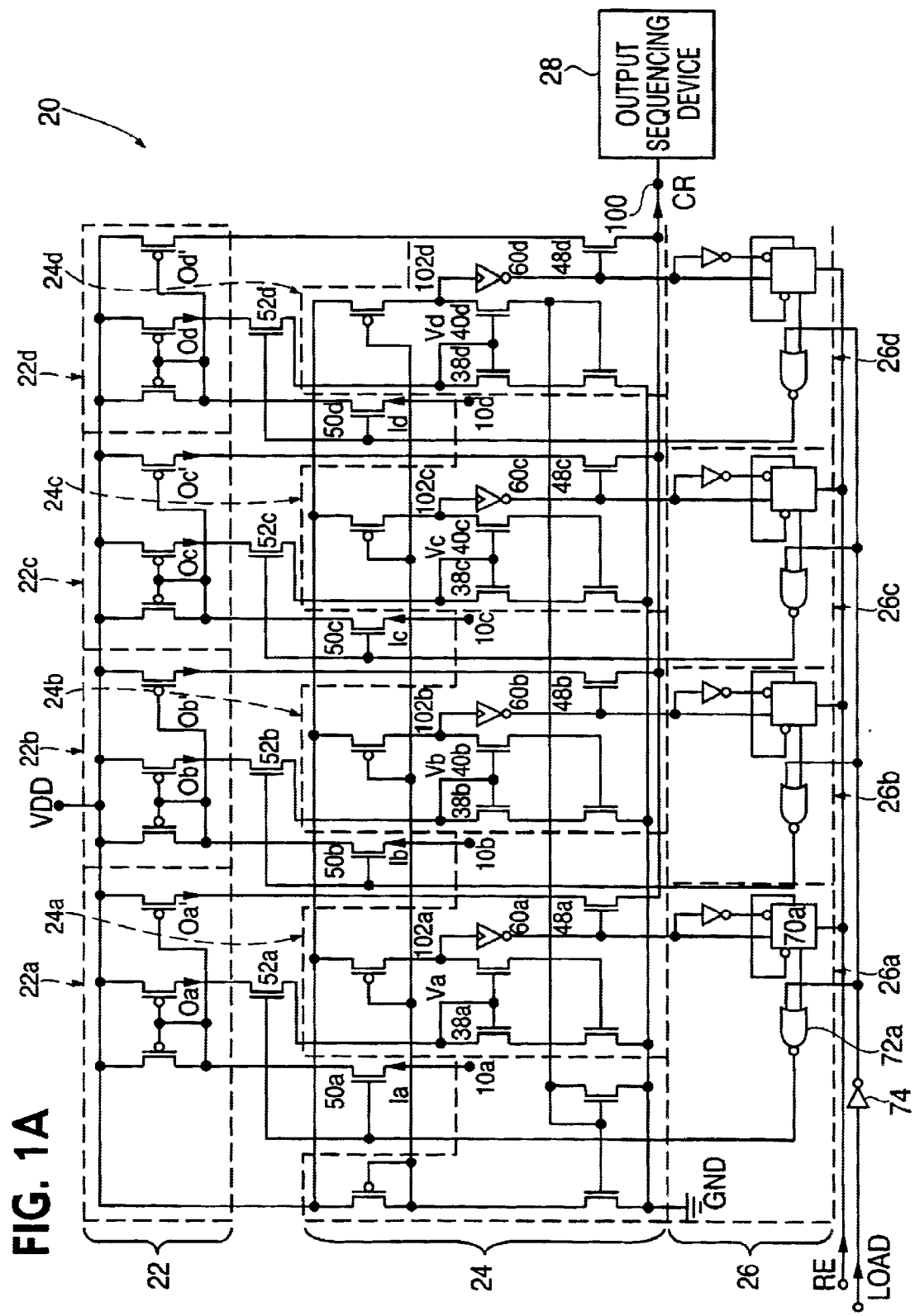
FIG. 1A is a schematic diagram of a signal sorting device consistent with an embodiment of the present invention.

Reference will now be made in detail to the present embodiments of the invention, examples of which are illustrated in the accompanying drawings.

Wherever possible, the same reference numbers will be used throughout the drawings to refer to the same or like parts.

Embodiments consistent with the present invention provide a signal sorting device and a signal sorting method for sorting input signals. Embodiments consistent with the invention also provide an output sequencing device for arranging the order of sorted output signals and separating the sorted results for outputting to multiple terminals providing sampled results. In addition, embodiments consistent with the invention allow IC implementations, such as, for example, implementations with complementary metal-oxide-semiconductor ("CMOS") transistors and other devices. In some embodiments, VLSI technology is applied to implement devices consistent with the invention.

Without limiting the scope and applications of the invention, the following paragraphs will illustrate the requirements of sorting operations performed for character, writing, or speech recognitions. These operations provide an example of the several applications of sorting devices consistent with the invention.

Signal processing performed for character, writing, or speech recognition applications has several requirements. First, it frequently requires a sorting operation not only to identify the input signal having the highest level, such as the highest current level or voltage level, among several input signals, but to sort other input signals in a specific sequence, such as a descending order, according to their signal levels, such as voltage or current levels. Second, in some applications, it is desirable for a sorting device to also provide actual or relative levels of input signals in sorted results. Third, signal processing operations for certain applications may require improved accuracy, efficiency, processing speed, and/or low power consumption of sorting devices.

Many known IC implementations of sorting operations, however, do not provide desirable signal processing operations. In most instances, they merely identify the input signal having the highest level among several input signals. However, they do not provide the actual or relative level of the highest input signal and identify other signals and their levels, such as identifying the second highest input signal and its actual or relative level. Furthermore, some implementations operate only within a limited range of input signal levels and do not provide accurate comparisons for input signals having very close levels. The limited result and accuracy generated by these implementations may often limit the functionality and accuracy of character, writing, and speech recognitions and other types of signal processing.

Some embodiments consistent with the invention, in contrast, can provide a signal sorting device that allows IC implementations. Embodiments consistent with the invention also provide improved efficiency and functionalities and reduce restrictions on the operations of signal sorting devices.

FIG. 1A illustrates a signal sorting device 20 according to one embodiment of the invention. Signal sorting device 20, as shown in FIG. 1A, includes a circuit for receiving four input signals, $I_a$, $I_b$, $I_c$, and $I_d$, and outputs a compared result to a compared output terminal 100. While the number of inputs is here shown as four by way of examples, the number of inputs can be expanded to process more inputs or reduced to process fewer inputs with the same configuration of signal processing units that will be described below. Therefore, the circuit can be modified to process a different number of inputs for different applications.

Signal sorting device 20 in embodiments consistent with the present invention includes an input section 22, a comparing section 24, a control section 26, and an optional output sequencing device 28. The following paragraphs will discuss the various sections and output sequencing device 28 and will discuss their operations with embodiments consistent with the present invention.

Referring to FIG. 1A, input section 22 of signal sorting device 20 is coupled to a voltage source VDD; to signal input terminals 10a, 10b, 10c, and 10d through respective input switches 50a, 50b, 50c, and 50d; to control section 24 through respective output switches 52a, 52b, 52c, and 52d, and to compared output terminal 100 through output switches 48a, 48b, 48c, and 48d. Input section 22 comprises input units 22a, 22b, 22c, and 22d. Each input unit is coupled to respective input terminals 10a, 10b, 10c, and 10d to respectively receive input signals Ia, Ib, Ic, and Id. Each input unit also generates one or more output signals based on the level, such as the current level or the voltage level, of a corresponding input signal. In other words, each output signal is indicative of the level of the corresponding input signal. As an example, an output signal may be indicative or representative of the level of an input signal either by providing substantially the same level as the original signal or by providing a representative level that has a certain relationship with the original signal, such as having a certain ratio or a certain mathematical relationship. Furthermore, examples of a signal level include a current level and a voltage level.

While the number of inputs and respective processing stages is here shown as four, it is to be understood that the number of inputs can be expanded to process more inputs or reduced to process fewer inputs with the same configuration of signal processing units that will be described below. In other words, a signal sorting device may employ less or more input, comparing, control, and/or sample and hold units with the same configuration or circuitry as the units discussed in the embodiments below to process less or more inputs.

The following paragraphs will describe the configuration of input section 22, using input unit 22a as an illustrative example.

Figure 1B:
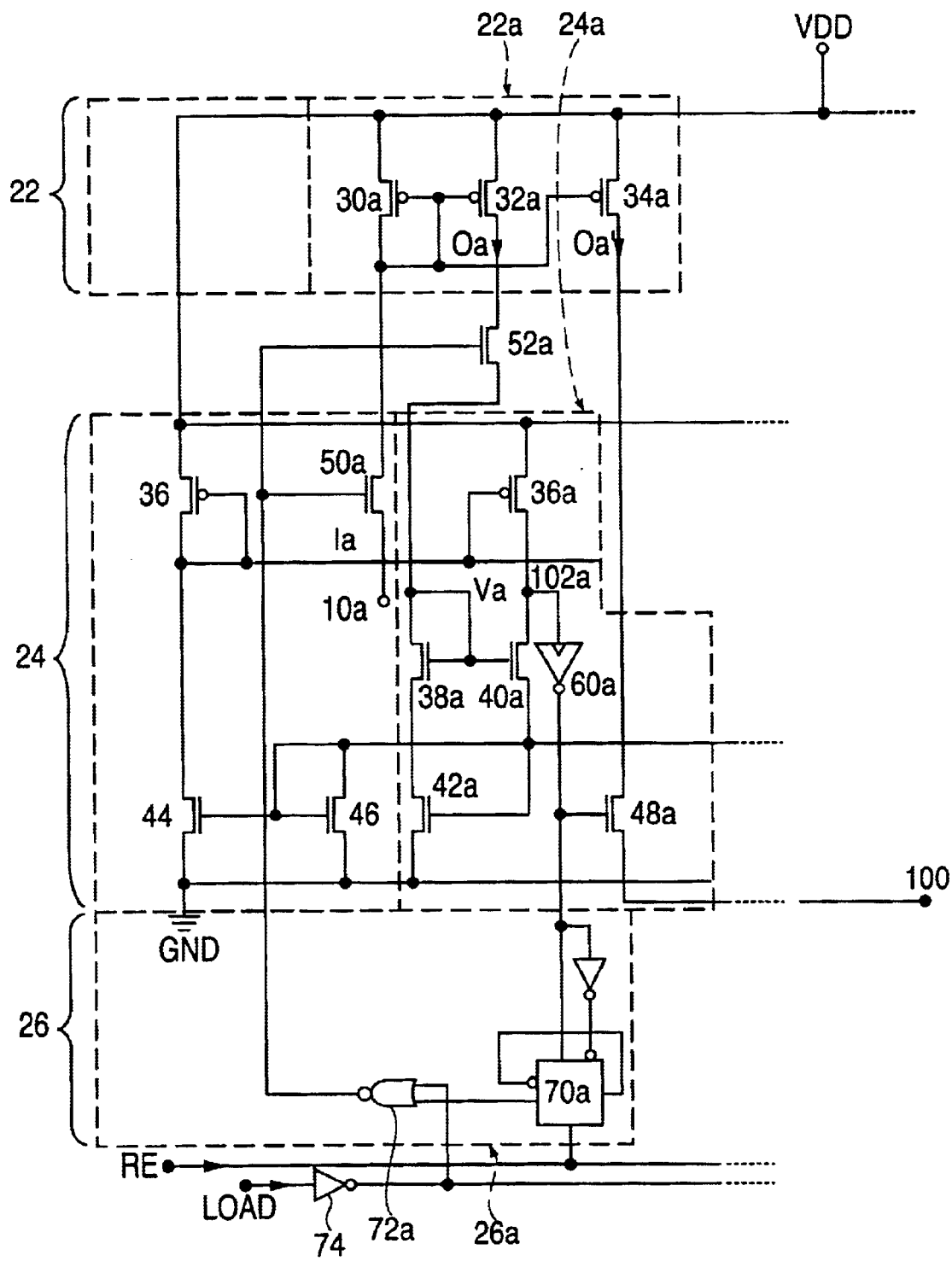
FIG. 1B is a schematic diagram of an input unit, a comparing unit, and a sample and hold unit of a signal sorting device consistent with an embodiment of the present invention.

FIG. 1B provides an enlarged view of input unit 22a, a comparing unit 24a and a control unit 26a as shown in FIG. 1A. Input unit 22a receives an input signal Ia from input terminal 10a and generates, through two output terminals, two output signals Oa and Oa', respectively that are indicative of the level of input signal Ia. In one embodiment, input unit 22a may use one or more current mirrors to generate one or more output signals that are indicative of a current level of input signal Ia.

In one embodiment, input unit 22a uses three transistors to form two current mirrors and provides two current output signals to two respective output terminals. In embodiments consistent with the present invention, a transistor may have a gate, a source terminal, and a drain terminal for electrical couplings. For the first current mirror, input unit 22a includes an N-type metal oxide semiconductor (NMOS) transistor 30a and an NMOS transistor 32a. Each of NMOS transistors 30a and 32a has a terminal chosen from one of its source and drain terminals coupled to voltage source VDD. The gates of NMOS transistors 30a and 32a couple together with a terminal chosen from the other of the source and drain terminals of NMOS transistor 30a that receives input signal Ia through input transistor 50a. NMOS transistor 32a provides output signal Oa through the terminal chosen from the other of its source and drain terminals. Accordingly, NMOS transistors 30a and 32a form the first current mirror that provides output signal Oa indicative of the current level of input signal Ia.

For the second current mirror, input unit 22a uses NMOS transistor 30a and an NMOS transistor 34a, employing the same configuration as the first current mirror and sharing NMOS transistor 30a with the first current mirror. As a result, NMOS transistor 34a has a terminal chosen from one of its source and drain terminals coupled to voltage source VDD and provides output signal Oa' through a terminal chosen from the other of its source and drain terminals. Similarly, output signal Oa' is indicative of the current level of input signal Ia.

In the two current mirrors, the physical and or performance characteristics of NMOS transistors 30a, 32a, and 34a, such as channel lengths, widths, and length-width ratios, may determine the relationship between output signal Oa and input signal Ia and between output signal Oa' and input signal Ia. As a result, input unit 22a may provide output signals Oa and Oa' as having substantially the same current as input signal Ia, or having approximately one-half the current of input signal Ia, or otherwise having a certain ratio with the current of input signal Ia.

Referring to FIG. 1A, each of input units 22b, 22c, and 22d uses the same configuration as input unit 22a described above to provide two output signals for each input signal. As a result, output signals Ob and Ob' are indicative of a current level of Ib; output signals Oc and Oc' are indicative of a current level of Ic; and output signals Od and Od' are indicative of a current level of Id. Therefore, input section 22 receives four input signals Ia, Ib, Ic, and Id and generates two output signals for each of the input signals, including Oa through Od and O' a through Od', for the operations of comparing section 24 as described below.

Comparing section 24 is coupled to voltage source VDD, to eight terminals providing output signals Oa through Od and Oa' through Od', and to compared output terminal 100 in one exemplary embodiment, as shown in FIG. 1A. Receiving the output signals from input section 22, comparing section 24 compares the output signals and provides a compared result or results to compared output terminal 100.

Comparing section 24 includes four comparing units 24a, 24b, 24c, and 24d in one exemplary embodiment. Each comparing unit receives one output signal for comparing with output signals received by other comparing units and receives another output signal for outputting to the compared output terminal 100. The configuration of the comparing section 24 is described below, using comparing unit 24a as an illustrative example.

Referring to FIG. 1B, comparing unit 24a receives output signal Oa from input unit 22a through output switch 52a. Comparing unit 24a comprises five transistors 36a, 38a, 40a, and 42a as a part of its comparing circuit. In addition, comparing unit 24a also has an output switch 48a and an inverter 60a that controls the output of comparing unit 24a. As another part of the comparing circuit of comparing unit 24a, comparing section 24 has three transistors 36, 44, and 46 that are shared by four comparing units 24a, 24b, 24c, and 24d.

The couplings between the transistors in comparing unit 24a and comparing section 24 are described below by referring to FIG. 1B. Transistors 36a and 36 are PMOS transistors and each has a terminal chosen from one of its source and drain terminals coupled to voltage source VDD. The gates of transistors 36a and 36 are coupled together with a terminal chosen from the other of the source and drain terminals of transistor 36 and also a terminal chosen from one of the source and drain terminals of transistor 44, which is an NMOS transistor. Transistor 38a is an NMOS transistor that has a terminal chosen from one of its source and drain terminals coupled to its gate that receives output signal Oa from control unit 22a through output switch 52a. Transistor 40a is an NMOS transistor that has its gate coupled to the gate of transistor 38a and a terminal chosen from one of its source and drain terminals coupled to a terminal chosen from the other of the source and drain terminals of transistor 36a and a notification terminal 102a.

Furthermore, Transistor 42a is an NMOS transistor has a terminal chosen from one of its source and drain terminals coupled to a terminal chosen from the other of the source and drain terminals of transistor 38a, the gate of transistor 44, and the gate and a terminal chosen from one of the source and drain terminals of transistor 46, which is an NMOS transistor. Transistor 42a also has a terminal chosen from the other of its source and gate terminals coupled to a ground terminal GND and its gate coupled to a terminal chosen from the other of the source and drain terminals of transistor 40a. Each of transistors 44 and 46 has a terminal chosen from the other of its source and drain terminals coupled to ground terminal GND.

In addition to the transistors above, output switch 48a has its gate coupled to a notification terminal 102 through inverter 60a to control the output of comparing unit 24a. Output switch 48a has a terminal chosen from one of its source and drain terminals coupled to the terminal providing output signal Oa' and has a terminal chosen from the other of its source and drain terminals coupled to compared output terminal 100.

Referring to FIG. 1A, inverter 60a and other similarly situated inverters 60b, 60c, and 60d in comparing units 24b through 24*d* may comprise an asymmetric inverter. FIG. 2 shows an example of an asymmetric inverter circuit that inverter 60*a* may use. Inverter 60*a* receives an inverted notification signal from notification terminal 102*a* and outputs an inverted result to an output terminal 88. The signal on notification terminal 102*a* is provided to operate transistors 80, 82, and 84 and then to operate an amplifier 86 to provide a notification signal on output terminal 88 with the couplings illustrated below.

Transistors 80, 82, and 84 are NMOS transistors. Transistors 80, 82, 84 form a serial connection with their source and drain terminals and have a terminal chosen from one of the source and drain terminals of transistor 80 coupled to voltage source VDD and a terminal chosen from the other of the source and drain terminals of transistor 84 coupled to ground terminal GND. Each of transistors 80 and 82 has its gate coupled to notification terminal 102*a*. The transistor 84 has its gate coupled to a terminal chosen from one of its source and drain terminals and also a terminal chosen from the other of the source and drain terminals of transistor 82. A terminal chosen from the other of the source and drain terminals of transistor 80 and a terminal chosen from one of the source and drain terminals of transistor 82 are coupled to output terminal through amplifier 86.

Based on the configuration, a logic-high signal on notification terminal 102*a* turns on transistors 80, 82, and 84 and causes an input to amplifier 86 to drop to a logic-low status. Therefore, output terminal 88 receives a logic-low signal as the notification signal. In contrast, a logic-low signal on notification terminal 102*a* causes output terminal 88 to receive a logic-high signal as the notification signal. Inverter 60*a* may provide a lower input impedance at notification terminal 102*a* and maintains the output of output terminal 88 at a stable logic level.

Referring to FIG. 1A, comparing units 24*b*, 24*c*, and 24*d* in comparing section 24 each uses the same configuration as that of comparing unit 24*a* described above and shares transistors 36, 44, and 46 with other comparing units. In one embodiment, transistors 38*a*, 40*a*, and 42*a* in comparing unit 24*a* and also other similarly situated transistors in comparing unit 24*b*, 24*c*, and 24*d* have the same physical dimensions that affect their operations, such as channel widths, lengths, and length-width ratios. The following paragraphs will illustrate the operation of comparing section 24, using comparing unit 24*a* as an illustrative example.

Referring again to FIG. 1B, the output signal Oa, if present, will establish a voltage Va on the gate of transistor 38*a*. Each of output signals Ob through Od, if present, will also establish a voltage level on the gate of a corresponding transistor that is similarly situated as transistor 38*a*. Accordingly, referring to FIG. 1A, a voltage Vb is established on the gate of a transistor 38*b* by output Ob; a voltage Vc is established on the gate of a transistor 38*c* by output Oc; and a voltage Vd is established on the gate of a transistor 38*d* by output Od. With the circuit configuration noted above, transistors 38*a*, 30*b*, 38*c*, and 38*d* constitute a differential circuit that enables a current to flow through the differential transistor having the largest voltage established on its gate.

Assuming output signal Oa provides the largest current among output signals Oa through Od in an initial load cycle, it will provide Va as the largest voltage among voltages Va through Vd. Referring to FIG. 1B, voltage Va will turn on transistor 40*a* and also cause a current to flow through a branch including transistors 36*a*, 40*a*, and 46. The current will cause the voltage level on notification terminal 102*a* to drop and provide a logic-low signal. The logic-low signal is provided to inverter 60*a* and a logic-high signal is provided from inverter 60*a* as a notification signal to signify that output signal Oa provides the highest current among output signals Oa through Od. In comparing section 24, one of the functions of transistors 36, 44, 46, and 36*a* is to adjust the current going through the branch of transistors 36*a*, 40*a*, and 46.

In contrast, because output signals Oc through Od provide current levels lower than that of output signal Oa, the voltages provided on transistors 38*c* through 38*d* are lower than that on transistor 38*a*. Accordingly, transistors 40*b* through 40*d* are not turned on and the voltage levels on notification terminals 102*b* through 102*d* remain at logic-high levels. Therefore, inverters 60*b* through 60*d* each outputs a logic-low signal.

The signal comparing operation in comparing section 24 causes compared output terminal 100 to receive output signal Oa', which is indicative of input signal Ia. Referring again to FIG. 1B, the logic-high notification signal provided by inverter 60*a* turns on output switch 48*a* to allow compared output terminal 100 to receive output signal Oa'. At the same time, the logic-low signals provided by inverters 60*b*–60*d*, as shown in FIG. 1A, do not turn on output switches 48*b* through 48*d*. Therefore, compared terminal 100 receives no other signals other than output signal Oa'. As described above, output signal Oa' is indicative of input signal Ia. Because output signal Oa has the highest signal level among output signals Oa through Od, which are respectively indicative of input signals Ia through Id, input signal Ia has the highest signal level among output signals.

Therefore, the compared output terminal 100 receives a signal, output signal Oa', that is indicative of the input signal having highest level among all of the input signals. When the input signals are input currents, output signal Oa' indicates the current level of input signal Ia. In one embodiment, the current level of output signal Oa' is substantially the same as the current level of input signal Ia.

According to the operation described above, comparing section 24, in the initial load cycle, identifies the input signal having the highest level and outputs a compared result to compared output terminal 100 that is indicative of the input signal having the highest level. To allow signal sorting device 20 to identify other input signals sequentially based on their levels in later load cycles, control section 26, which will be described below, controls input section 22 and comparing section 24 to perform further comparing operations in the later load cycles.

Referring to FIG. 1A, control section 26 is coupled with input section 22 through input switches 50*a* through 50*d* and is coupled with comparing section 24 through output switches 52*a* through 52*d*, in one embodiment. In addition, control section 26 receives notification signals from comparing section 24, a set of load signals LOAD, and reset signal RE. Based on this configuration, control section 26 controls input section 22 and comparing section 24 to effectuate multiple comparing operations in response to multiple load signals.

Control section 26 includes four control units 26*a*, 26*b*, 26*c*, and 26*d* that may respectively activate and deactivate corresponding input units 22*a*, 22*b*, 22*c*, and 22*d*, or corresponding comparing units 24*a*, 24*b*, 24*c*, and 24*d*, or both, at appropriate timings. By controlling the input units and/or the comparing units, control section 26 allows signal sorting device 20 to sequentially identify the highest signal, the second highest signal, the third highest signal, and so forth.

The configuration of the control units in control section 26 is described below, using control unit 26a as an illustrative example.

Referring to FIG. 1B, control unit 26a includes a latch 70a and a NOR gate 72a. Latch 70a receives a notification signal from comparing unit 24a. NOR gate 72a receives inverted load signals through an inverter 74. Latch 70a is designed to maintain a logic-low output until it receives a logic-high notification signal from comparing unit 24a. After receiving a logic-high notification signal, latch 70a outputs a logic-high signal after a predetermined delay and maintains the logic-high signal output until latch 70a is reset. As will be explained below, the purpose of the delay is to maintain the output of output signal Oa' on compared output terminal 100 for a certain period of time without cutting it off immediately due to the change in the output status of latch 70a. To reset latch 70a, control unit 26a may include a resetting device that is embedded in latch 70a to receive reset signal RE and reset latch 70a to its initial state of outputting a logic-low signal.

Referring to FIG. 1A, control units 26b, 26c, and 26d uses the same configuration as control unit 26a to control respective input units 22b, 22c, and 22d and respective comparing unit 24a, 24b, and 24c. To further illustrate the operation of control section 26, the following paragraphs will discuss the operation of control unit 26a as an illustrative example.

Figure 3:
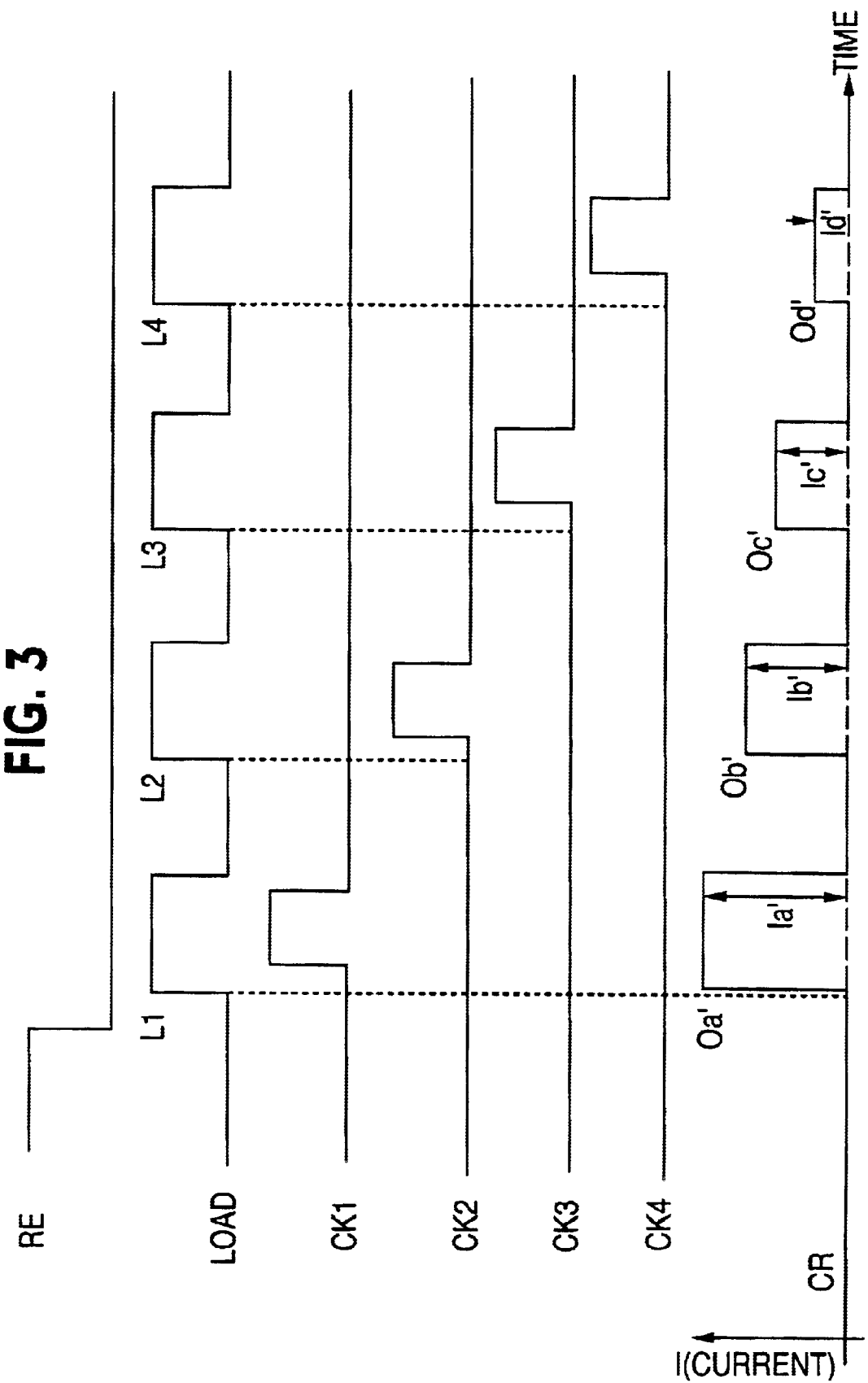
FIG. 3 illustrates waveform diagrams of a reset signal, four load signals, four clock signals, and compared results as a function of time consistent with an embodiment of the present invention.

As noted above, control section 26 receives a set of load signals LOAD, reset signal RE, and notification signals from comparing section 24. FIG. 3 shows the waveform diagrams of reset signal RE, a set of load signals L1 through L4, four clock signals CK1 through CK4, and a set of compared results CR consistent with an embodiment of the present invention, all shown as a function of time. As illustrated in this embodiment, reset signal RE is provided and then dropped to a logic-low status before initial load signal L1 is provided. Also, the leading edges of clock signals CK1, CK2, CK3, and CK4 lag behind the leading edges of respective load signals L1, L2, L3, and L4. Furthermore, compared results CR includes four output signals Oa', Ob', Oc', Od' having respective current levels Ia', Ib', Ic', and Id', which are provided shortly after the leading edges of respective load signals L1, L2, L3, and L4 and before leading edges of respective clock signals CK1, CK2, CK3, and CK4 in one embodiment.

Initially, all of the control units in control section 26 activate all of the input units in input section 22 and all of the comparing units in comparing section 24. The initial reset signal in FIG. 3 causes latch 70a of control unit 26a to output a logic-low signal to NOR gate 72a. When initial load signal L1 is provided, NOR gate 72a receives another logic-low signal through inverter 74. Receiving two logic-low signals, NOR gate 72a outputs a logic-high signal to turn on both switches 50a and 52a to activate input unit 22a and comparing unit 24a. Similarly, control units 26b through 26d also turn on switches 50b through 50d and switches 52b through 52d to activate input units 22b through 24d and comparing units 24b through 24d. Having all units activated, signal sorting device 20 identifies input signal Ia in the initial load cycle as described and provides output signal Oa' that is indicative of the input signal Ia on compared output terminal 100, as described above.

As explained above, FIG. 3 shows the waveform diagrams of compared results CR provided on compared output terminal 100 as a function of time after signal sorting device 20 has operated four load cycles in response to four load signals L1 through L4. Compared results CR includes four output signals Oa', Ob', Oc', Od' having respective current levels Ia', Ib', Ic', and Id', which are provided shortly after the leading edges of respective load signals L1, L2, L3, and L4 and before leading edges of respective clock signals CK1, CK2, CK3, and CK4 in one embodiment.

To sort the other input signals in order, control unit 26a deactivates input unit 22a, comparing unit 24, or both, before the next load cycle to have signal sorting device 20 identify the second highest input signal of the input signals during the next load cycle. As described in one embodiment above, comparing unit 24a outputs a logic-high signal as the notification signal after identifying input signal Ia as having the highest level. Upon receiving the notification signal, latch 70a outputs, usually with a predetermined delay, a logic-high signal to NOR gate 72a and maintains the same logic-high output until it receives a reset signal. The delay enables maintaining the output of output signal Oa' on compared output terminal 100 for a certain period of time, such as for approximately the time period of a load cycle, without cut it off immediately due to the change of output status of latch 70a. By having at least one logic-high input, NOR gate 72a outputs a logic-low signal that turns off switches 50a and 52a. Disconnecting input signal Ia from input unit 22a and output signal Oa from comparing unit 24a, control unit 26a therefore deactivates input unit 22a and comparing unit 24a until receiving a next reset signal. Not receiving the highest signal Ia signal sorting device 20 therefore operates to compare input signals Ib, Ic, and Id and identifies the second highest input signal among them when the next load signal L2 is provided.

After the second highest input signal is identified, signal sorting device 20 operates with the same procedure as described above to identify the third highest input signal when third load signal L3 is provided, and then identify the fourth highest input signal when third load signal L3 is provided. For illustrative purposes, it is assumed in one embodiment that input signals Ia , Ib, Ic, and Id are current input signals and Ia>Ib>Ic>Id based on their current levels. With the operation described above, signal sorting device 20 therefore provides output signals Oa', Ob', Oc', Od' overtime on compared output terminal 100 as compared results CR, as shown in FIG. 3. The output signals Oa', Ob', Oc', Od' are respectively indicative of the current levels of input signals Ia, Ib, Ic, and Id and are sorted in a descending order over time.

Signal sorting device 20 in embodiments consistent with the present invention therefore provides a set of sorted and compared results CR on compared output terminal 100 with the configurations and operations described above. In some applications, it may be desirable that signals of different levels are provided on separate terminals in the same or a different order to facilitate other signal processing applications or functions. Therefore, signal sorting device 20 may optionally include an output sequencing device 28, as explained below, to provide sorted and/or sampled results on separate terminals and/or with a different order.

Figure 4A:
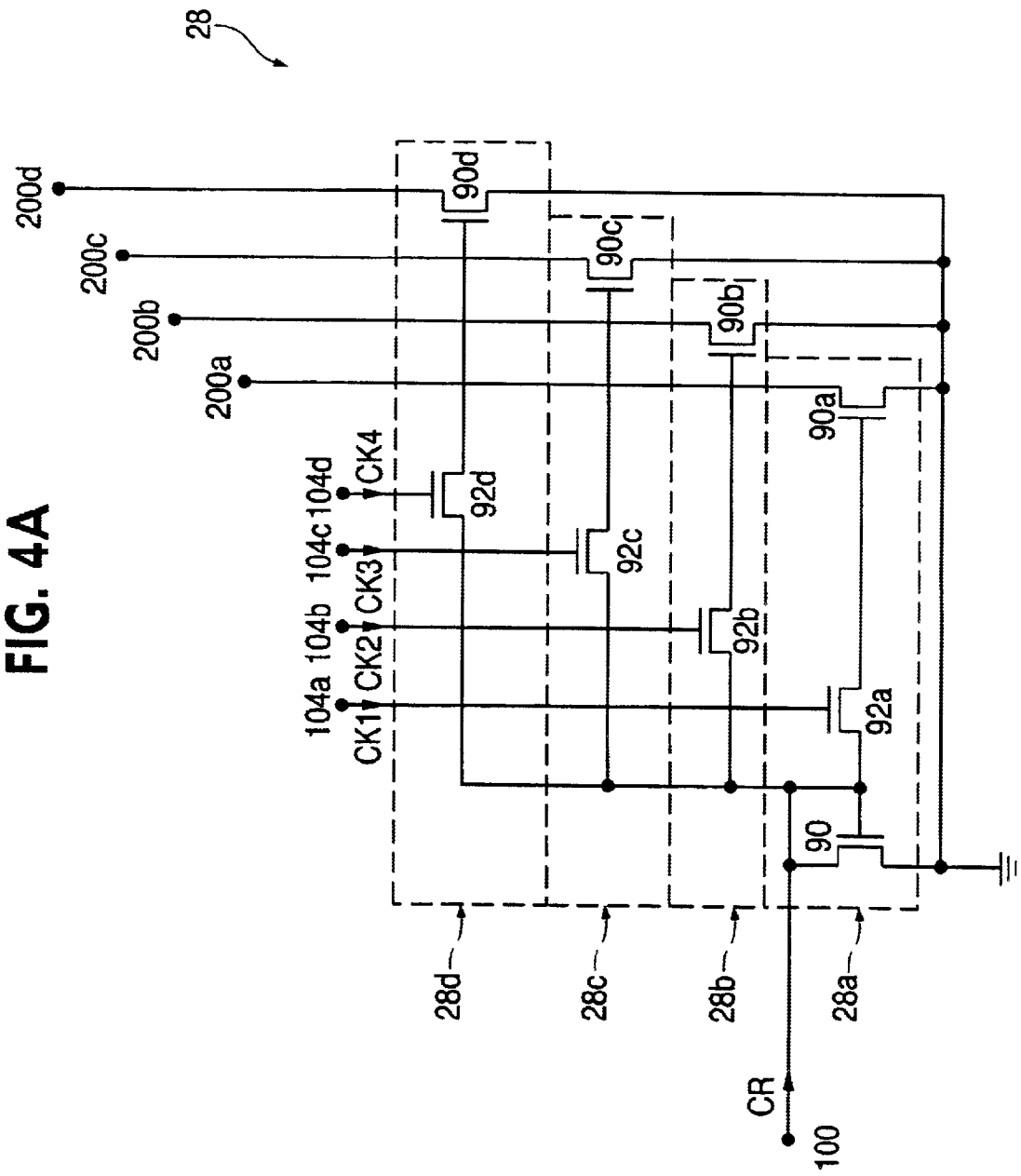
FIG. 4A is a schematic diagram of an output sequencing device consistent with an embodiment of the present invention.

Referring to FIG. 4A, output sequencing device 28 is coupled with compared output terminal 100 and four clock terminals 104a, 104b, 104c, and 104d to provide four output terminals 200a, 200b, 200c, and 200d. Compared output terminal 100 serves as an input terminal for output sequencing device 28 to process compared results CR from signal sorting device 20. Clock terminals 104a, 104b, 104c, and 104d respectively provide clock signals CK1, CK2, CK3, and CK4 based on the timing of different signals in compared results CR to allow sampling of those signals. Output terminals 200a, 200b, 200c, and 200d each provides a sampled result that represents one of the signals provided in compared results CR.

To provide sampled results, output sequencing device 28 includes four sample and hold units 28a, 28b, 28c, and 28d. Sample and hold units 28a, 28b, 28c, and 28d share a common NMOS transistor 90, as shown by the circuitry shown in FIG. 4A. Each of the sample and hold units 28a, 28b, 28c, and 28d receives a corresponding clock signal of clock signals CK1, CK2, CK3, and CK4 from a corresponding clock terminal of clock terminals 104a, 104b, 104c, and 104d. Each of the sample and hold units 28a, 28b, 28c, and 28d also outputs a sampled result to a corresponding output terminal of output terminals 200a, 200b, 200c, and 200d. The configuration of each sample and hold unit can be illustrated by using sample and hold unit 28a as an example.

Sample and hold unit 28a may use a current mirror controlled by clock signal CK1. For example, sample and hold circuit 28a uses two transistors 90 and 90a to form a current mirror and a control transistor 92a for controlling the operation of the current mirror. Transistors 90 and 90a and control transistor 92a are NMOS transistors. Transistor 90 has its gate and a terminal chosen from one of its source and drain terminals coupled with compared output terminal 100. Each of transistors 90 and 90a has its gate coupled together through the source and drain terminals of control transistor 92a. Transistor 90a provides a sampled result to output terminal 200a through a terminal chosen from one of its source and drain terminals. Each of transistors 90 and 90a has a terminal chosen from the other of its source and drain terminals coupled to ground terminal GND. Control transistor 92a has its gate coupled to clock terminal 104a.

Figure 5:
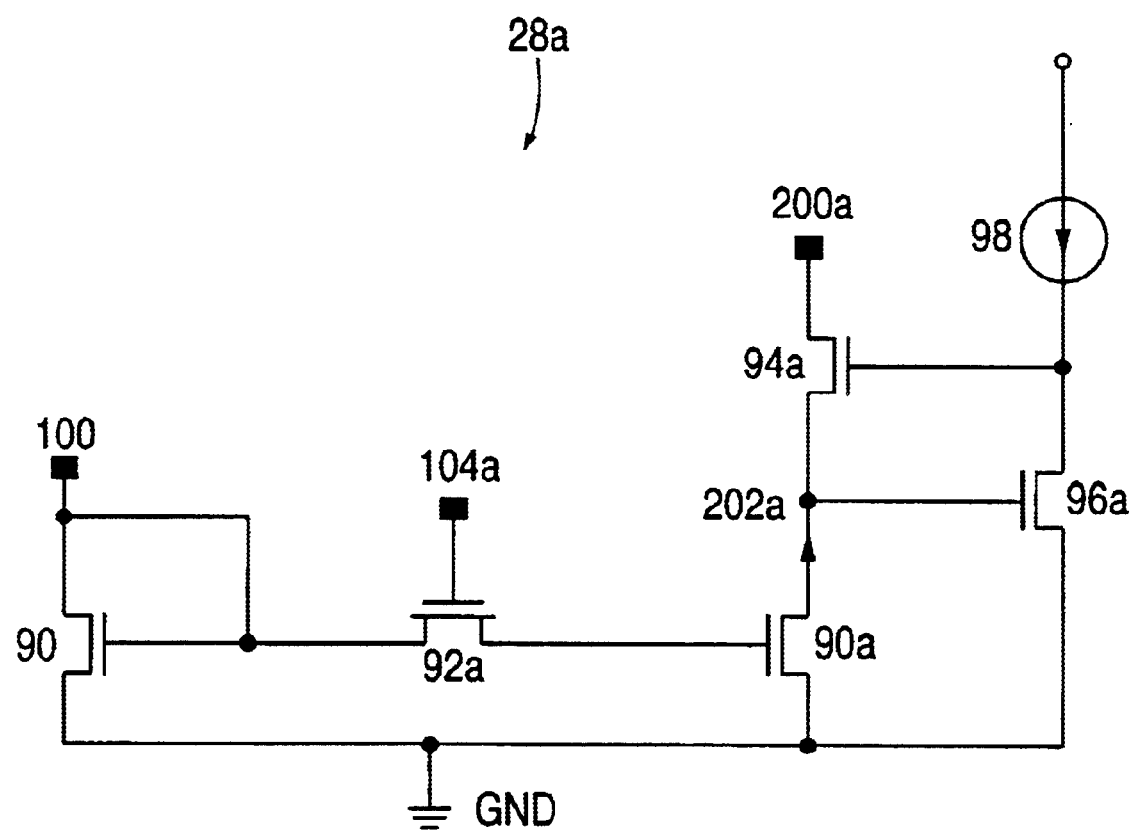
FIG. 5 is a schematic diagram of a sample and hold unit having a regulated-gate-cascode configuration consistent with an embodiment of the present invention.

In addition to the configuration above, the current mirror used in sample and hold unit 28a may use a regulated gate-cascode ("RGC") configuration in one embodiment. Referring to FIG. 5, to form the RGC configuration, a current output terminal 202a of the current mirror is coupled to two transistors 94a and 96a. Transistor 94a is an NMOS transistor and has its gate connected to a reference current source 98, a terminal chosen from one of its source and drain terminals connected to output terminal 200a, and a terminal chosen from the other of its source and drain terminals connected to current output terminal 202a of the current mirror. Second transistor 96a has its gate connected to current output terminal 202a of the current mirror, a terminal chosen from one of its source and drain terminals connected to reference current source 98, and a terminal chosen from the other of its source and drain terminals connected to ground terminal GND. In some embodiments, the RGC configuration of a sample and hold unit increases an output impedance and advantageously reduces the load effect of the sample and hold unit.

Figure 4B:
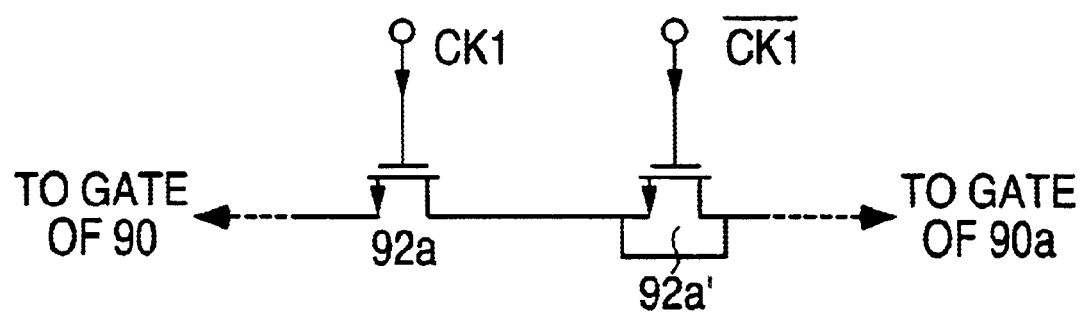
FIG. 4B shows the use of a dummy transistor coupled with a control transistor consistent with an embodiment of the present invention.

Furthermore, the current mirror used in sample and hold unit 28a may include a dummy transistor to reduce the effects of an injected current from control transistor 92a in FIG. 4A. In some embodiments, control transistor 92a may affect the current flowing through transistor 90 due to a small clock signal current injected through the gate of control transistor 92a. The injected current causes the current flowing through transistor 90 to drop after control transistor 92a is turned off and clock signal CK1 is no longer supplied. To reduce the effect of the injected current, sample and hold unit 28a may include a dummy transistor. FIG. 4B shows the use of a dummy transistor 92a' that is serially coupled with control transistor 92a in one embodiment. Other control transistors 92b, 92c, and 92d may adopt the same dummy transistor design. Attentively, reducing the input voltage of clock signal CK1 may also reduce the injected current. If the voltage level of clock signal CK1 is not much higher than the threshold voltage needed for turning-on control transistor 92a, the injected current is reduced and its effect on the current flowing through transistor 90 is minimized.

Using the current mirror configuration and the optional RGC and/or dummy transistor configuration described above, sample and hold unit 28a therefore samples and holds the current level flowing through compared output terminal 100 when it receives clock signal CK1. Sample and hold unit 28 also outputs to output terminal 200a an output signal that is indicative of the current level that the sample and hold unit 28 samples when it receives clock signal CK1. The characteristics of transistors 90 and 90a may affect the relationship between the output signal and the current level that is sampled. In some embodiments, the output signal is designed to be substantially the same as the current level sampled or has a predetermined ratio With the current level sampled.

Referring to FIG. 4A, sample and hold units 28b, 28c, and 28d each uses the same current mirror configuration as sample and hold unit 26a, sharing transistor 90. Therefore, sample and hold unit 28b forms a current mirror by means of transistors 90, 90b, and 92b; sample and hold unit 28c forms a current mirror by transistors 90, 90c, and 92c; sample and hold unit 28d forms a current mirror by transistors 90, 90d, and 92d. Sample and hold units 28b, 28c, and 28d each also may incorporate the RGC configuration described above. Accordingly, each of sample and hold units 28a, 28b, 28c, and 28d, when receiving a corresponding clock signal of clock signals CK1, CK2, CK3, and CK4, samples and holds a signal level at compared output terminal 100 and generates a sampled output indicative of the signal level sampled. The following paragraphs will discuss an example to illustrate the operation of output sequencing device 28, using compared results CR provided in FIG. 3.

The input signals provided to output sequencing device 28 on compared output terminal 100 include output signals Oa' through Od', which provide current levels Ia' through Id', as shown in FIG. 3, and are sorted in a descending order over time according to their current levels. Each of current levels Ia', Ib', Ic', and Id' is provided during each of the load cycles defined by load signals L1, L2, L3, and L4. To sample and hold the first output signal Oa', clock signal CK1 is provided after the leading edge of load signal L1, lagging approximately 0.5 to 1.0 microseconds or more in some embodiments. The lag time between clock signal CK1 and the leading edge of load signal L1 signal can be shorter or longer than this range, depending on factors such as the processing time of signal sorting device 20 and the system requirements. In some embodiments, a lag time that is too short will cause output sequencing device 28 to sample and hold an output signal before it is present. In contrast, a lag time that is too long will cause output sequencing device 28 to sample and hold a diminished output signal after it is cut off in some embodiments.

Each of clock signals CK2, CK3, and CK4 may follow the leading edge of a corresponding load signal of load signals L2, L3, and L4 in the same manner, as shown in FIG. 3. As a result, sample and hold unit 28a provides a first sampled result indicative of the level of output signal Oa to output terminal 200a; sample and hold unit 28b provides a second sampled result indicative of the level of output signal Ob' to output terminal 200b; sample and hold unit 28c provides a third sampled result indicative of the level of output signal Oc' on output terminal 200c; sample and hold unit 28c provides a fourth sampled result indicative of the level of output signal Od' on output terminal 200d. Output sequencing device 28 therefore provides four sampled results separately on output terminals 200a through 200d in a descending order based on the current levels of the sampled results.

Alternatively, output sequencing device 28 can provide the sampled results in any order on output terminals 200a through 200d. For example, output sequencing device 28 can provide output signals on output terminals 200a through 200d in an ascending order or other predetermined orders. Rearranging the sequence of clock signals CK1 through CK4 over time or altering the connections of output terminals 200a through 200d to another circuit will modify the order of the sampled results to satisfy different needs.

Furthermore, embodiments consistent with the present invention may provide a fewer number of sample and/or clock signals than the number of signals provided by signal sorting device 20. The number may depend on the number of sampled outputs needed for a particular application. In addition, four different clocks may provide four clock signals CK1 through CK4 that are shown in FIG. 3. Alternatively, a signal clock may provide four clock signals CK1 through CK4 to four clock input terminals 104a through 104d at different timings with a proper clock output control device in some embodiments.

Output sequencing device 28 in embodiments consistent with the present invention operates to separate out and/or rearrange the order of the signals on compared output terminal 100. Output sequencing device 28 provides the separated, sampled results to multiple output terminals, with one sampled signal on each output terminal. By providing one sampled signal on each terminal, output sequencing device 28 also may rearrange the signals on the output terminals in any order, such as an ascending, a descending, or other predetermined orders.

In addition to the embodiments of a signal sorting device described a above, the invention also provides a signal sorting method. In embodiments consistent with the invention, a signal sorting method may include several steps. As an example, four input signals, such as input signals, $I_a$, $I_b$, $I_c$, and $I_d$ discussed above, may be provided for a sorting operation and several output signals indicative of the levels of the four input signals are generated. In one embodiment, two output signals indicative of the level of a corresponding input signal are generated for each of the four input signals. Therefore, eight output signals, such as output signals Oa through Od and Oa' through Od' indicative of corresponding input signals of input signals $I_a$, $I_b$, $I_c$, and $I_d$, are generated in one embodiment.

The output signals generated are then compared for generating a result that is indicative of a level of a largest output signal, which has the highest level among all of the output signals. After the result is generated, the largest output signal, an input signal corresponding to the largest output signal, or both, may be disconnected such that a second comparing operation may be performed to provide a result indicative of a level of a second largest output signal, which has the second highest level among all of the output signals. In one embodiment, the largest output signal, the input signal corresponding to the largest output signal, or both, may be disconnected after a leading edge of a first load signal, such as initial load signal L1 discussed above, that is provided to activate the comparing of the output signals.

In an embodiment consistent with the invention, the input signals may be current input signals. Accordingly, an output signal, namely a current output signal, may have a current level that is substantially the same as the current level of a corresponding input signal in some embodiments. In the embodiments in which two current output signals are provided for each current input signal, one of the current output signal may be directly provided as the result of the comparison if the current output signal has the largest current among all of the current output signals. Furthermore, a notification signal may be provided to activate a device, such as output switches 48a through 48d provided in FIG. 1A, to provide one of the current output signals directly to a terminal providing the result of comparison.

Table 1 below illustrates simulation results for testing the characteristic of a signal sorting device with four current input signals according to one embodiment of the invention. The simulation included three scenarios having different levels of current input signals. To assess the accuracy of the signal sorting device, the simulation computed the maximum deviation between each one of the output currents and a corresponding input current for each scenario.

TABLE 1

| Scenarios | $I_{in1}/I_{out1}$ (μA) | $I_{in2}/I_{out2}$ (μA) | $I_{in3}/I_{out3}$ (μA) | $I_{in4}/I_{out4}$ (μA) | Maximum deviation (μA) |
|---|---|---|---|---|---|
| First | 6.5/6.52 | 6.2/6.22 | 6.0/6.02 | 5.0/5.02 | 0.02 |
| Second | 65/64.75 | 60/59.79 | 55/54.82 | 50/49.85 | 0.25 |
| Third | 165/163.98 | 163/162.01 | 155/154.07 | 150/149.11 | 1.02 |

As illustrated by Table 1, in a first scenario, when input currents ranged from 5 μA to 6.5 μA, a maximum deviation of only 0.02 μA was observed. In a second scenario, when input currents ranged from 50 μA to 65 μA, a maximum deviation of only 0.25 μA was observed. In a third scenario, when input currents ranged from 150 μA to 165 μA, a maximum deviation of only 1.02 μA was observed. Accordingly, the deviation between any input current and its corresponding output current was always below 1%, even with different current levels in input currents. Based on the results, the signal sorting device of the invention provides improved accuracy with less complicated circuitry than convention signal sorting circuits, which frequently have maximum deviations near 10% between the input and output currents.

Figure 6A:
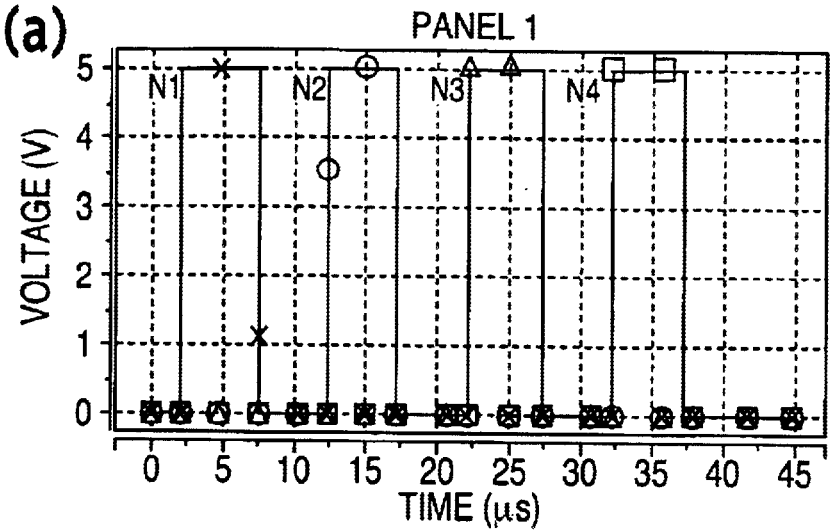
FIGS. 6(a)–6(c) are waveform plots showing a set of simulation results of a signal sorting device consistent with an embodiment of the present invention.
Figure 6B:
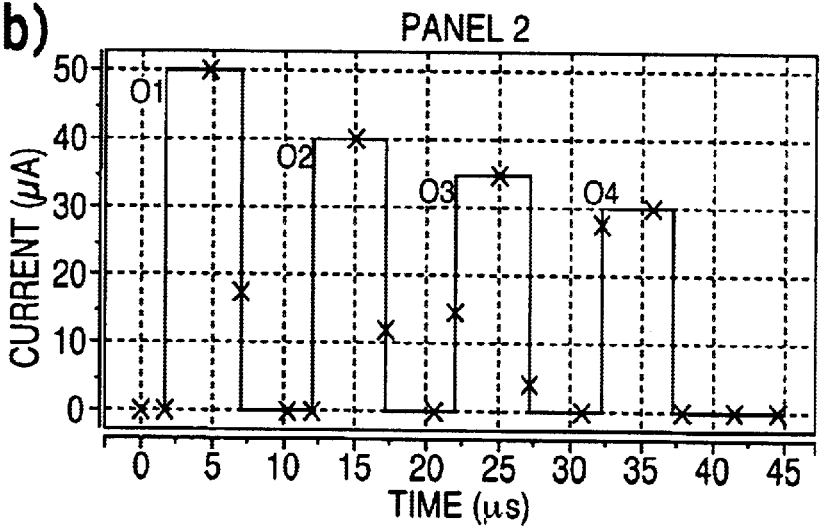
Figure 6C:
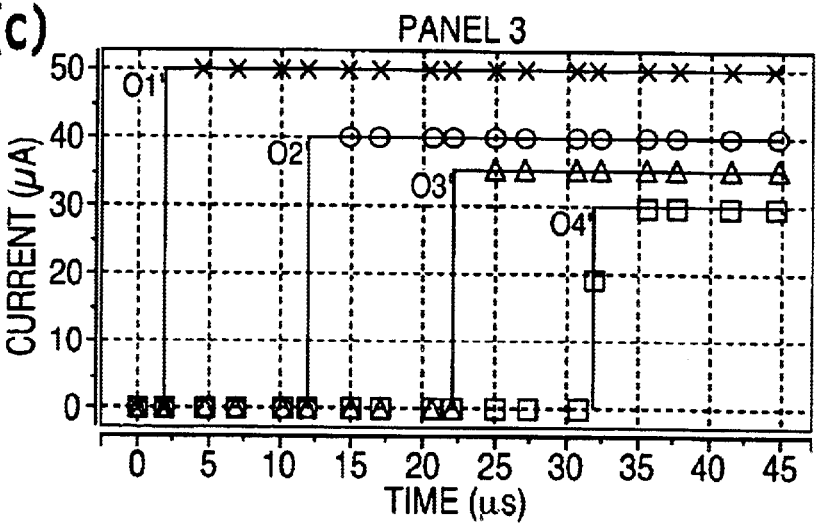

FIGS. 6(a)–6(c) show another set of simulation results of a signal sorting device with four current input signals in one embodiment. FIG. 6(a) shows the voltage levels of notification signals N1, N2, N3, and N4 outputted from inverters 60a, 60b, 60c, and 60d in FIG. 1A. Each of the notification signals was provided to a corresponding control unit of control units 26a, 26b, 26c, and 26d at different times. FIG. 6(b) shows the signals on a compared output terminal, with compared results O1, O2, O3, and O4 outputted at different times sequentially and in response four load signals. Based on the operation of the signal sorting device, O1 was indicative of the highest input signal, O2 was indicative of the second highest input signal, O3 was indicative of the third highest input signal, and O4 was indicative of the fourth highest input signal. FIG. 6(c) shows sampled results O1', O2', O3' and O4', each being provided on one of the four output terminals of an output sequencing circuit. The output sequencing circuit therefore separated out compared results O1, O2, O3, and O4 by sampling each of them and outputting a current level indicative of the current level of each of them to one of the four output terminals.

To satisfy different sorting applications, the signal sorting device can be modified to perform different operations in some embodiments. For example, if a load signal provided to the device remains high all the time, the device becomes a circuit for providing the input with the highest signal level, or a one-WTA (winner-take-all) circuit. Alternatively, if an output sequencing device is provided with only the last clock signal, such as clock signal CK4 in the embodiments described above, a signal sorting device becomes a circuit for identifying the input signal with the lowest signal level. Similarly, if an output sequencing device is provided with only the first clock signal, such as clock signal CK1 in the embodiments described above, a signal sorting device becomes a circuit for identifying the input signal with the highest signal level.

Embodiments consistent with the present invention provide a signal sorting device and a signal sorting method that may provide improved accuracy under certain circumstances. The signal sorting device in some embodiments requires fewer transistors and provides less complicated circuitry than conventional devices. The device may require fewer clock signals, control signals, and/or bias circuits than other signal sorting devices. In addition, the device is self-adaptive in some embodiments because it provides accuracy without requiring modification or adjustment when input conditions or input current levels vary. Furthermore, the number of transistors needed is approximately proportional to the number of input terminals in some embodiments. Finally, the embodiments described above for a signal sorting device and a signal sorting method can be implemented with CMOS transistors and other circuit elements consistent with VLSI technology.

Other embodiments of the invention will be apparent to those skilled in the art from consideration of the specification and practice of the invention disclosed herein. It is intended that the specification and examples be considered as exemplary only, with a time scope and spirit of the invention being indicated by the following claims.

What is claimed is:

1. A signal sorting device comprising:
   an input section comprising a first input unit and a second input unit, the first input unit receiving a first input signal to responsively generate a first output signal that is indicative of a level of the first input signal, the second input unit receiving a second input signal to responsively generate a second output signal that is indicative of a level of the second input signal;
   a comparing section coupled with the input section and configured to compare the first output signal and the second output signal to responsively generate a compared result, the comparing section comprising a first comparing unit and a second comparing unit;
   a control section coupled with the input section and the comparing section, wherein
   the control section activates the first input unit, the second input unit, the first comparing unit, and the second comparing unit when receiving an initial load signal and deactivates, before receiving a second load signal, at least one of the first input unit and the first comparing unit when the first output signal is greater than the second output signal, the compared result being indicative of a level of the first output signal when the first output signal is greater than the second output signal.

2. The device as claimed in claim 1, wherein the control section comprises a resetting device for receiving a reset signal to reset the control section such that the control section activates the first input unit, the second input unit, the first comparing unit, and the second comparing unit when receiving a first load signal after the reset signal.

3. The device as claimed in claim 1, further comprising an output sequencing section coupled with a compared output terminal of the signal sorting device, the output sequencing device comprising a sample and hold unit, wherein the sample and hold unit, when receiving a clock signal, samples and holds a signal from the compared output terminal to responsively generate a sampled output, the sampled output being indicative of a level of the signal from the compared output terminal at a time when the sample and hold unit receives the clock signal.

4. The device as claimed in claim 3, wherein the clock signals follows a leading edge of a load signal for operating the signal sorting device by a time difference of no less than approximately 0.5 microseconds.

5. The device as claimed in claim 1, wherein the first input signal comprises a first input current and the second input signal comprises a second input current.

6. The device as claimed in claim 5, wherein the first input unit comprises a first current mirror and the second input unit comprises a second current mirror.

7. The device as claimed in claim 6, wherein the first current mirror generates the first output signal that has a current level substantially the same as a current level of the first input signal and the second current mirror generates the second output signal that has a current level substantially the same as a current level of the second input signal.

8. The device as claimed in claim 1, wherein the first input unit provides two current output terminals that include a first terminal carrying a first current and a second terminal carrying a second current, wherein both the first current and the second current are indicative of a current level of the first input signal.

9. The device as claimed in claim 8, wherein the first comparing unit comprises a switch coupling between the second terminal of the first input unit and the compared output terminal.

10. The device as claimed in claim 9, wherein the first comparing unit, when the first output signal is greater than the second output signal, provides a notification signal to the switch to connect the second terminal of the first input unit to the compared output terminal.

11. The device as claimed in claim 10, wherein the comparing unit further comprises an asymmetric inverter for providing the notification signal.

12. The device as claimed in claim 1, wherein the comparing section further comprises a differential circuit for comparing the first output signal and the second output signal.

13. The device as claimed in claim 1, wherein the control section comprises
   a first input switch coupled between the first input unit and a terminal carrying the first input signal; and
   a second input switch coupled between the second input unit and a terminal carrying the second input signal,
   wherein the control section deactivates the first input unit by turning off the first input switch and deactivates the second input unit by turning off the second input switch.

14. The device as claimed in claim 1, wherein the control section comprises
   a first output switch coupled between the first comparing unit and a terminal carrying the first output signal; and
   a second output switch coupled between the second comparing unit and a terminal carrying the second output signal,
   wherein the control section deactivates the first comparing unit by turning off the first output switch and deactivates the second comparing unit by turning off the second output switch.

15. A current sorter comprising:

an input section being configured to receive at least two current input signals to responsively generate at least two current output signals, the input section generating at least one current output signal for each current input signal of the current input signals, the current output signal being indicative of a current level of a corresponding current input signal of the current input signals;

a comparing section coupled with the input section and configured to compare the current output signals to responsively generate a compared result that is indicative of a largest current output signal, which is a current output signal having a largest current among the current output signals; and a control section coupled with the input section and the comparing section, the control section being configured to receive load signals, to connect the current input signals to the input section upon receiving an initial load signal of the load signals, and to disconnect from the input section a largest current input signal, which is a current input signal having a largest current among the current input signals, before receiving a second load signal of the load signals, wherein the largest current output signal corresponds to the largest current input signal and is indicative of the largest current input signal.

16. The current sorter as claimed in claim 15, wherein the control section connects the current output signals to the comparing section upon receiving the initial load signal and disconnects the largest current output signal from the comparing section before receiving the second load signal.

17. An output sequencing device comprising:

an input terminal providing an input signal from a compared output terminal of a signal sorting device;

a clock section providing a clock signal; and a sample and hold unit coupled to the input terminal and the clock section, wherein the sample and hold unit, when receiving the clock signal, samples and holds a signal level of the input signal and generates a sampled output that is indicative of the signal level of the input signal at a time when the sample and hold unit receives the clock signal.

18. The device as claimed in claim 17, wherein a level of the input signal may vary over time with load signals provided to operate the signal sorting device.

19. The device as claimed in claim 18, wherein the clock signal follows a leading edge of a load signal of the load signals by a time difference of no less than approximately 0.5 microseconds.

20. The device as claimed in claim 17, wherein the clock section provides at least two clock signals and the output sequencing device includes at least two sample and hold units to provide at least two sampled outputs on at least two sampled output terminals in an order selected from a descending order, an ascending order, and a prescribed order.

21. The device as claimed in claim 20, wherein the order of the sampled outputs is based on current levels of the sampled outputs.

22. The device as claimed in claim 17, wherein the sample and hold unit comprises a current mirror controlled by the clock signal.

23. The device as claimed in claim 22, wherein the current mirror generates the sampled output when receiving the clock signal and provides a current substantially the same as a current of the input signal at a time when the current mirror receives the clock signal.

24. The device as claimed in claim 22, wherein the current mirror has a regulated-gate-cascode configuration.

25. The device as claimed in claim 24, wherein a current output terminal of the current mirror connects to a transistor set comprising:

a first transistor having a gate thereof connecting to a reference current source, a terminal chosen from one of source and drain terminals thereof connecting to a sampled output terminal, and a terminal chosen from the other of the source and drain terminals thereof connecting to the current output terminal of the current mirror; and a second transistor having a gate thereof connecting to the current output terminal of the current mirror, a terminal chosen from one of source and drain terminals thereof connecting to the reference current source, a terminal chosen from the other of the source and drain terminals thereof connecting to a ground terminal.

26. A signal sorting method comprising:

providing a first input signal and a second input signal;

generating a first output signal that is indicative of a level of the first input signal and generating a second output signal that is indicative of a level of the second input signal;

comparing the first output signal and the second output signal and generating a result that is indicative of a level of the first output signal when the first output signal is greater than the second output signal; and disconnecting at least one of the first input signal and the first output signal after the result is generated.

27. The method as claimed in claim 26, wherein at least one of the first input signal and first output signal is disconnected after a leading edge of a first load signal that is provided to activate the comparing of the first output signal and the second output signal.

28. The method as claimed in claim 26, wherein the first output signal has a current level that is substantially the same as a current level of the first input signal and the second output signal has a current level that is substantially the same as a current level of the second input signal.

29. The method as claimed in claim 26, wherein providing the first output signal comprises providing a first current signal and a second current signal that are indicative of a current level of the first input signal.

30. The method as claimed in claim 29, wherein generating the result that is indicative of the level of the first output signal comprises providing the second current signal as the result when the first output signal is greater than the second output signal.

31. The method as claimed in claim 30, further comprising generating a notification signal, when the first output signal is greater than the second output signal, to activate a device to provide the second current signal to a terminal providing the result.

32. A current sorting method comprising:

providing at least two current input signals;

generating at least two current output signals to provide at least one current output signal for each current input signal of the current input signals so that the current output signal provided is indicative of a current level of a corresponding current input signal of the current input signals;

comparing the current output signals to generate a result that is indicative of a largest current output signal, which is a current output signal having a largest current among the current output signals; and disconnecting a largest current input signal, which is a current input signal having a largest current among the current input signals, wherein the largest current output signal corresponds to the largest current input signal and is indicative of a current level of the largest current input signal.

33. The method as claimed in claim 32, wherein the largest input current signal is disconnected after the result is generated.

* * * * *